(12) United States Patent
Keller et al.

(10) Patent No.: US 6,545,308 B2
(45) Date of Patent: *Apr. 8, 2003

(54) FUNNEL SHAPED STRUCTURE IN POLYSILICON

(75) Inventors: David J. Keller, Boise, ID (US); Louie Liu, Meridian, ID (US); Kris K. Brown, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/092,414

(22) Filed: Mar. 5, 2002

(65) Prior Publication Data

US 2002/0084478 A1 Jul. 4, 2002

Related U.S. Application Data

(62) Division of application No. 09/487,094, filed on Jan. 19, 2000, now Pat. No. 6,432,765, which is a continuation of application No. 08/892,928, filed on Jul. 15, 1997, now Pat. No. 6,018,173, which is a division of application No. 08/589,622, filed on Jan. 22, 1996, now Pat. No. 5,652,170.

(51) Int. Cl.$^7$ ............................................. H01L 27/108
(52) U.S. Cl. ...................................................... 257/296
(58) Field of Search ................................ 257/296, 298, 257/306, 311

(56) References Cited

U.S. PATENT DOCUMENTS

| | | | |
|---|---|---|---|
| 4,694,561 A | 9/1987 | Lebowitz | 437/52 |
| 4,726,879 A | 2/1988 | Bondur et al. | 156/643 |
| 4,784,720 A | 11/1988 | Douglas | 156/643 |
| 4,951,175 A | 8/1990 | Kurosawa et al. | 361/313 |
| 5,010,378 A | 4/1991 | Douglas | 357/23.6 |
| 5,111,259 A | 5/1992 | Teng et al. | 357/23.6 |
| 5,242,536 A | 9/1993 | Schoenborn | 156/643.1 |
| 5,256,245 A | 10/1993 | Keller et al. | 156/643.1 |
| 5,354,716 A | 10/1994 | Pors et al. | 437/60 |
| 5,381,365 A | 1/1995 | Ajika et al. | 365/149 |
| 5,423,941 A | 6/1995 | Komura et al. | 156/643.1 |
| 5,444,013 A | 8/1995 | Akram et al. | 437/49 |
| 5,472,564 A | 12/1995 | Nakamura et al. | 216/51 |
| 5,487,811 A | 1/1996 | Iizuka | 156/656.1 |
| 5,522,966 A | 6/1996 | Komura et al. | 156/662.1 |
| 5,652,170 A | 7/1997 | Keller et al. | 365/149 |
| 5,885,865 A * | 3/1999 | Liang et al. | 438/253 |
| 5,951,175 A | 9/1999 | Kawamori et al. | 400/120.01 |
| 6,010,930 A | 1/2000 | Keller et al. | 438/238 |

* cited by examiner

Primary Examiner—David Nelms
Assistant Examiner—Quoc Hoang
(74) Attorney, Agent, or Firm—Workman, Nydegger & Seeley

(57) ABSTRACT

Disclosed is a vertically oriented capacitor structure, which is of particular usefulness in MOS DRAM memory modules. The structure has upper and lower polysilicon capacitor plates separated by a dielectric layer, each of the plates and dielectric layers sloping at an angle of about 80–85 degrees with respect to an underlying silicon substrate. As such, the novel capacitor is formed in a sloped contact opening. The contact area of electrical connection of the lower capacitor plate with an underlying active region has a sufficiently small horizontal cross-section that the contact area will not extend laterally beyond the active region and leakage will not occur. A method for forming the contact opening is disclosed and comprises first, the formation of an active region, preferably located between two insulating bird's beak regions, and covering the active area with a thin layer of oxide etch barrier material. A polysilicon layer is then formed above the oxide etch barrier. The etch is subsequently performed with the use of a diatomic chlorine etchant. Four embodiments are disclosed as variations on the step of etching the polysilicon with the diatomic chlorine etch chemistry.

20 Claims, 3 Drawing Sheets

FUNNEL SHAPED STRUCTURE IN POLYSILICON

RELATED APPLICATIONS

This is a divisional application of U.S. patent application Ser. No. 09/487,094, filed on Jan. 19, 2000, now U.S. Pat. No. 6,432,765 B1, which is a continuation of U.S. patent application Ser. No. 08/892,928, filed on Jul. 15, 1997, now U.S. Pat. No. 6,018,173, which is a divisional application of U.S. patent application Ser. No. 08/589,622, filed on Jan. 22, 1996, now U.S. Pat. No. 5,652,170. This application is related to U.S. patent application Ser. No. 08/928,041, filed on Sep. 11, 1997, now U.S. Pat. No. 6,010,930. All of the foregoing patents are incorporated herein by reference.

BACKGROUND OF THE INVENTION

1. The Field of the Invention

The present invention relates to a sloped contact opening in a polysilicon layer, and a method for etching the sloped contact opening which is selective to oxide. More particularly, the present invention is directed to a vertically oriented capacitor formed within a sloped contact opening in a layer of polysilicon with an underlying oxide etch barrier layer, and a corresponding method for forming a vertically oriented capacitor within the sloped contact opening.

2. The Relevant Technology

Integrated circuits are being designed on an increasingly smaller scale. The smaller scale is necessary to make the integrated circuits more efficient, and aids in constructing the integrated circuits at a lower cost. These are particularly desirable characteristics in certain areas such as DRAM fabrication. One difficulty, however, in fabricating integrated circuits such as DRAM memory modules is in allocating sufficient surface area for the many capacitors that are required therein.

Traditional MOS capacitors are horizontally oriented and require a high amount of surface area. To overcome this problem, the prior art has used various forms of vertically oriented capacitors, including "stacked" capacitors. Such capacitors have a cylindrical shape with an inner plate made of a conducting material such as polysilicon, the inner plate being surrounded by a dielectric such as silicon dioxide, and an adjacent outer capacitor plate also made of a conducting material. The stacked capacitor is typically formed on a silicon substrate. A region of the substrate known as the active region is located at the bottom of the contact opening within which the vertically oriented capacitor is formed. The active region connects to the inner plate of the capacitor, which connection connects the capacitor with other semiconductor devices formed on the silicon substrate. One example of a stacked capacitor is given in U.S. Pat. No. 4,951,175 to Kei Kurosawa.

A contact opening 28 for a stacked capacitor is seen in FIG. 1. An underlying substrate 10 has formed thereon an active region 12, which is typically a source or drain region of a transistor. Above active region 12 is contact opening 28 formed in a polysilicon layer 26. Two field oxide "bird's beaks" isolation regions (not shown) can be located to either side of active region 12.

FIG. 2 is a further construction of a stacked capacitor within contact opening 28 seen in FIG. 1. An inner capacitor plate 36 is typically formed within contact opening 28 and is intended to make electrical contact with active region 12. A dielectric layer 37 is deposited over inner capacitor plate 36 and a outer capacitor plate 38 is deposited over dielectric layer 37.

It is undesirable that contact opening 28 make contact with one or more bird's beak isolation regions which may be located on either side of active region 12. It has proven difficult, however, to center contact opening 28 directly above active region 12, especially when active region 12 is a small area. Thus, it is undesirable that inner capacitor plate 36 formed within contact opening 28 overlap one of the bird's beak isolation regions that may be on either side of active region 12. Such an overlap may cause a leakage of the capacitor. Leakage from capacitors can cause failure in the particular circuit being formed. In the particular case where the capacitor is part of a memory cell of a DRAM memory module, a leaky capacitor will be unable to maintain charges between refresh states. This causes data corruption and thus a defect condition.

A further problem encountered with the structure of FIG. 2 is that polysilicon layer 26 is formed as the sidewall, seen in FIGS. 1 and 2 to be as thin as possible for greater device densities. Thus, the sidewalls of polysilicon layer 26 have a much greater dimension in the Y direction than in the X direction as seen in FIGS. 1 and 2. During the rigors of fabrication, the sidewalls of polysilicon layer 26 can be lifted completely off of underlying silicon substrate 10 due to their thinness. At the minimum, the sidewalls of polysilicon layer 26 can be bent or damaged. Thus, a structure with greater structural rigidity is desirable.

Accordingly, a method is needed for creating capacitors with smaller horizontal contact area to the underlying substrate. Particularly, a method is needed whereby a vertically oriented capacitor can be formed such that the capacitor can be easily located directly over an underlying active region of modest proportions without overlap into adjacent regions. Such a capacitor must also be relatively structurally rigid in order to overcome the problems discussed above.

SUMMARY AND OBJECTS OF THE INVENTION

The present invention seeks to resolve the above and other problems that have been experienced in the art. More particularly, the present invention constitutes an advancement in the art by providing a contact opening in a polysilicon layer having a straight sidewall etched at a sloped angle and a method for etching such a sidewall selective to oxide which achieves each of the objects listed below.

It is an object of the present invention to provide a capacitor which occupies a minimal amount of horizontal contact area on the underlying substrate, and particularly to provide a vertically oriented capacitor which has a buried contact having minimal surface area at the substrate.

It is also an object of the present invention to provide a contact opening having a straight sidewall etched in polysilicon at a sloped angle to the substrate, wherein a vertically oriented and sloped capacitor plate can be constructed.

It is a further object of the present invention to provide a funnel-shaped capacitor having sloping capacitor plates etched in polysilicon.

It is likewise an object of the present invention to provide a method for etching sidewalls in polysilicon, which etch is selective to oxide, such that the sidewalls will not punch through an oxide etch barrier layer of the etched structure.

It is further an object of the present invention to provide such a method which can form straight sidewalls which are sloped at an angle with respect to the substrate.

It is yet another object of the present invention to provide such a method which has a high etch rate for high manufacturing throughput.

To achieve the foregoing objects in a preferred embodiment, a structure is provided for a contact opening adjacent a straight sidewall having a sloping angle with respect to a substrate, the sidewall being etched through a layer of polysilicon above an oxide etch barrier layer. The contact opening is of particular usefulness in forming capacitors, especially capacitors in DRAM memory modules. The sloped sidewall structure aids in forming a compact capacitor which allows for a greater density of memory elements within the memory module. Thus, a typical contact opening of the present invention will be etched through a polysilicon layer located on a silicon substrate which has been provided with an active region under the polysilicon layer. The active region may have one or more field oxide bird's beak isolation regions adjacent to it. Above the active region and beneath the polysilicon layer is typically located an oxide etch barrier layer. The contact opening will extend through the oxide etch barrier layer to the active region. The contact opening is bordered by the active region and the oxide etch barriers. The contact opening will preferably not contact the field oxide bird's beak isolation regions adjacent to the active region.

The present invention also provides a method for etching contact openings in polysilicon with high selectivity to oxide to form straight sidewalls in the contact opening which are set at a sloping angle with respect to the underlying substrate. The method comprises the following steps. First, a silicon substrate is provided and thereon is formed an active region, which is typically doped by ion implantation. In DRAM applications, the active region typically is the source or drain of a MOS transistor. One or more field oxide "bird's beaks" insulating regions may be situated within the substrate adjacent to the active region. The field oxide "bird's beaks" insulating regions can be formed by localized oxidation of silicon (LOCOS) processing. Above the active region is then formed a thin etch barrier layer of oxide, typically silicon dioxide ($SiO_2$).

Above the etch barrier layer is then deposited a layer of polysilicon. In the process of forming a stacked capacitor, the polysilicon layer typically must be etched to form a contact opening within which the capacitor plate is formed. The contact opening is etched so as to have a straight sidewall set to slope at an angle relative to the plane of the underlying silicon substrate. In forming this contact opening, a process chemistry is selected that uses diatomic chlorine ($Cl_2$) as a base etchant. The present invention can be achieved using one of four embodiments of the $Cl_2$ base etchant.

The first embodiment comprises a two-step process that is conducted in a magnetically enhanced reactive ion etcher (MRIE). The first step utilizes pure $Cl_2$ exposed to the polysilicon at a low pressure, moderate power, and moderate magnetic field. The second step of this embodiment comprises the chemistry of $Cl_2$ and $HeO_2$ exposed to the polysilicon layer at low pressure, low power, and in a moderate magnetic field.

A second embodiment comprises the exposure of $Cl_2$ and $HeO_2$ to the polysilicon layer in an etcher for which power, pressure, and magnetic parameters have been optimized to provide a high etch rate and high selectivity to the underlying oxide etch barrier layer.

A third embodiment is an etch that is conducted in either a reactive ion etch system or a magnetically enhanced reactive ion etch system, and comprises the exposure of $Cl_2$ along with a passivating gas such as $N_2$ or $O_2$ to the polysilicon. The same parameters of low pressure and low to moderate power as described above are used.

A fourth embodiment is an etch conducted in a high density etcher, which etch uses $Cl_2$ chemistry and a passivation gas such as $N_2$ or $O_2$ or mixtures of $N_2$ and $O_2$ with He at a low pressure, a low bias power, and a wide range of source power.

Each of these embodiments etches a contact opening in the polysilicon layer that, when conducted for a proper amount of time for a desired depth of the contact opening, will result in a straight sidewall set at a sloped angle with respect to the underlying substrate. Furthermore, due to the high selectivity of the etch process to oxide, the etch will be conducted at a high rate on the polysilicon layer, yet will stop at an underlying oxide etch barrier layer without substantially punching through to the underlying active region, substrate, or other structures.

These and other objects, features, and advantages of the present invention will become more fully apparent from the following description and appended claims, or may be learned by the practice of the invention as set forth hereinafter.

DESCRIPTION OF THE DRAWINGS

In order that the manner in which the above-recited and other advantages and objects of the invention are obtained will become apparent, a more particular description of the invention briefly described above will be illustrated by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is based upon the discovery that sloping the sidewall of a contact opening for a capacitor avoids many leakage problems associated with conventional vertically oriented capacitors. Thus, the present invention comprises a vertically oriented capacitor formed within a contact opening having sloped sidewalls etched in polysilicon, and is particularly useful for forming DRAM memory modules. The present invention also comprises a method for forming a contact opening having sloped sidewalls by etching polysilicon with high selectivity to oxide.

Figure 3:
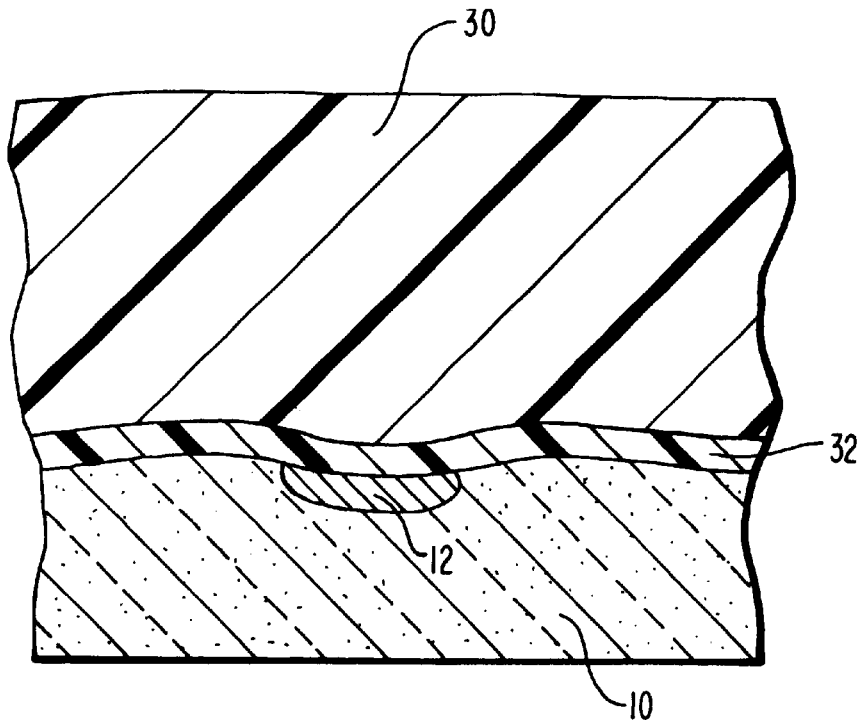
FIG. 3 is a cross-sectional diagram of a silicon wafer shown after initial steps of the method of the present invention.

The method of the present invention involves the steps illustrated in FIGS. 3 through 6. FIG. 3 shows the result of a series of process steps for a silicon substrate 10. A portion of silicon substrate 10 is doped, typically by photolithography, masking, and an ion bombardment doping of impurities so as to form active region 12. Active region 12 is typically a source or drain of a MOS transistor. One or more field oxide bird's beak isolation regions (not shown) can also be formed adjacent to active area 12. The method typically used for creating such bird's beak isolation regions is localized oxidation of silicon (LOCOS) processing. An oxide etch barrier layer 32 is formed above active region 12. A layer of polysilicon 30 is then formed above oxide etch barrier layer 32 using deposition methods commonly known in the art.

Figure 4:
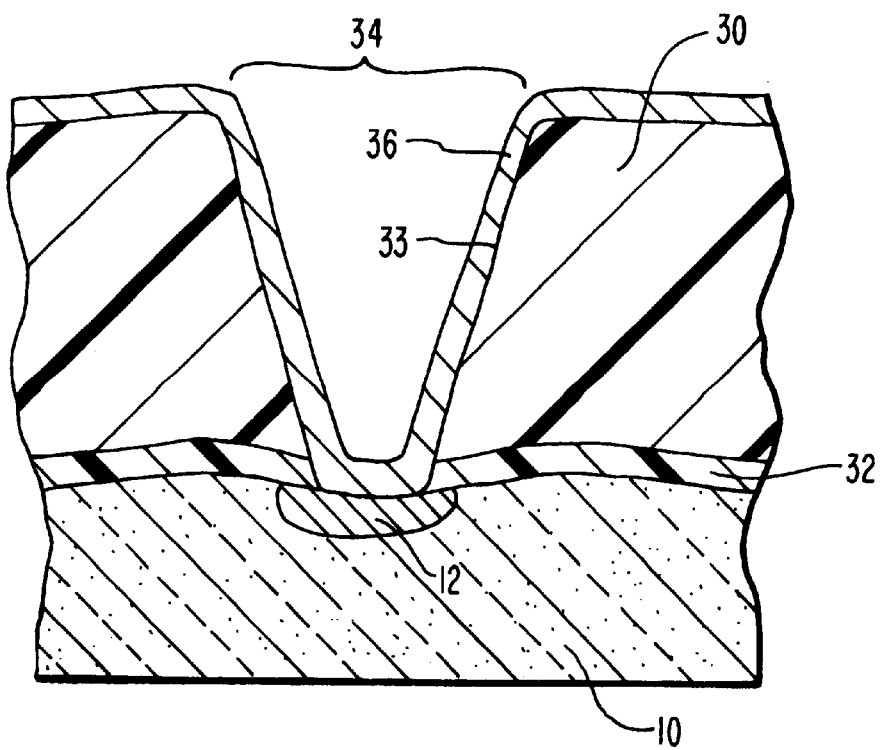
FIG. 4 is a cross-sectional illustration of the silicon wafer of FIG. 3 undergoing a further step of the method of the present invention.

The next step, shown in FIG. 4, comprises etching a contact opening through polysilicon layer 30 so as to form a substantially straight sidewall 33 that slopes at an angle with respect to silicon substrate 10. Sidewall 33 in polysilicon layer 30 is linearly straight and has a cross-sectional as shown in FIG. 4. Sidewall 33, which is set at an angle with respect to substrate 10, is referred to hereinafter as having a "sloped angle," of between about 80 and about 85 degrees from the plane of underlying silicon substrate 10. The etch is selective to oxide etch barrier layer 32 and etches polysilicon at a high rate, yet stops etching at oxide etch barrier layer 32, so as to not etch into active region 12.

The etch step seen in FIG. 4 uses a diatomic chlorine ($Cl_2$) etch chemistry with up to four different embodiments of the etch.

The first embodiment is performed in a magnetically enhanced reactive ion etcher, and comprises a two step process. The first step comprises the use of pure $Cl_2$, exposed to polysilicon layer 30 at a low pressure, moderate power, and with a moderate magnetic field. Low pressure is defined herein as a pressure in the range of between about 1 and 100 millitorr. Moderate power is defined herein as a power in the range of between about 200 and 700 Watts. A moderate magnetic field is defined herein as a field in the range of between about 50 and 100 Gauss.

The second step utilizes a chemistry of $Cl_2$ and $HeO_2$ exposed to polysilicon layer 30 at a low pressure, a low power, and with a moderate magnetic field. Low power is defined herein as a power in the range of between about 50 and 200 Watts.

The first embodiment of the method of the present invention has been found to be satisfactory, although a second embodiment achieves similar results with a one-step etch process. The one-step etch process uses the same chemistry as the first embodiment, but employs an etcher for which specific power, magnetic, and pressure parameters have been optimized to result in a high etch rate of polysilicon with high selectivity to oxide throughout the single step etch. In etchers, such as a LAM Research Rainbow™ or a LAM Research 9400™ high density etcher, the biasing and electrical parameters are modified for each machine for high selectivity to oxide with high etch rates for polysilicon. This optimizing process results in a contact opening with a straight sidewall set at the sloped angle as described above, but can be performed in one step for greater throughput. LAM Research etchers are manufactured by Lam Research, located in Fremont, Calif., U.S.A.

The third embodiment of the method of the present invention comprises the use of a magnetically enhanced reactive ion etch (MRIE) system using $Cl_2$ gas with a passivating gas such as $N_2$ or $O_2$ and similar process parameters to those stated above for the first embodiment. That is, low pressure is used as well as low to moderate power, as defined above. In so doing, the passivation gas in combination with the $Cl_2$ and the etch byproducts will form polymerizing compounds such as $Si_xCl_yO_z$ (where X, Y, and Z are variables) which will slow down the etch rate of oxide leading to enhanced polysilicon to oxide selectivity. This embodiment of the method of the present invention could also be performed in a reactive ion etcher (RIE). This polymerization in combination with carbon from the resist will form polymer on the polysilicon sidewall which will lead to the desired profile slope of between 80–85 degrees.

The fourth embodiment of the method of the present invention uses an etch chemistry of $Cl_2$ and a passivation gas such as $N_2$ or $O_2$. The passifying gas acts to inhibit the chlorine from etching the polysilicon in a anisotropic manner, as described above. As described above, a high density etcher is operated for the fourth embodiment at low pressure, low bias power, and at a wide range of top power. Low bias power is defined herein as a power applied at the bottom of a high density etcher in the range of between about 10 and 300 Watts. A wide range of top power is defined herein as power applied to the top of a high density etcher chamber in the range of between about 100 and 3000 Watts.

One example of a high density etcher is a LAM Research 9400. High density etchers typically have a chamber having a chuck with which power is applied at the bottom of the chamber. A power source is also located at the top of the chamber where a wound coil creates an electric field. The electrical field induces a plasma in the upper region of the chamber which allows more power to be applied to the system, yet does not raise the bias on the bottom of the chamber or reduce the selectivity to oxide. Thus, the bottom power determines the selectivity to oxide and the top power determines the etch rate of polysilicon. Consequently, both a high etch rate of polysilicon and a high selectivity to oxide can be maintained such that the etch can be performed in one step as was discussed with respect to first embodiment.

Each of the foregoing methods must be conducted for an appropriate amount of time with respect to the depth of the contact opening being etched in the polysilicon layer. Additionally, each of the foregoing methods is highly selective to oxide. This provides advantages in that a high etch rate of polysilicon is achieved for high throughput, yet an overetch will not occur. Thus, the etch will not extend substantially into contact opening 34 past active region 12. The etch can also be successfully conducted for contact openings having a high aspect ratio and will maintain a straight sidewall. In each of the embodiments, the combination of Si, Cl, and C with or without the passivating gases of $N_2$, $O_2$, or $He/O_2$ will lead to polymerization. This polymerization will cause the polysilicon profile to slope to the desired degree.

As seen in FIG. 4, a layer 36, composed of a conductive material such as polysilicon, is formed within contact opening 34 so as to make contact with active region 12. Layer 36, which can be formed by conventional techniques, is intended to be an inner plate for a capacitor.

Figure 1:
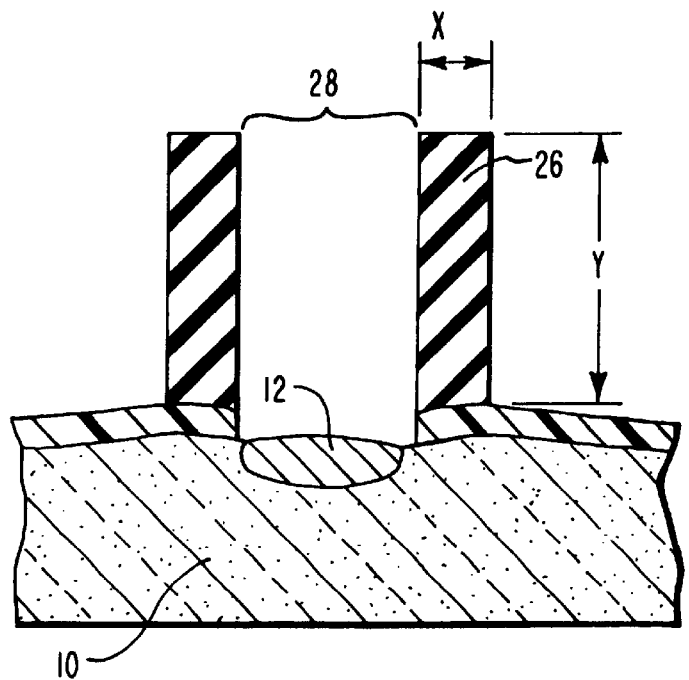
FIG. 1 is a cross-sectional view of a contact opening within which a prior art stacked capacitor is to be formed.
Figure 2:
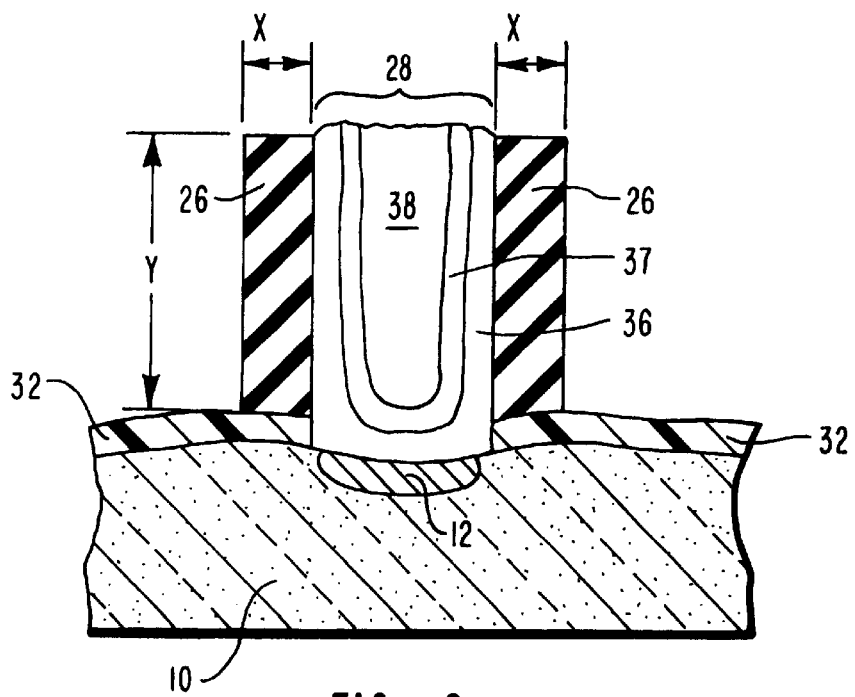
FIG. 2 is a cross-sectional illustration of a prior art stacked capacitor formed within the contact opening seen in FIG. 1.
Figure 5:
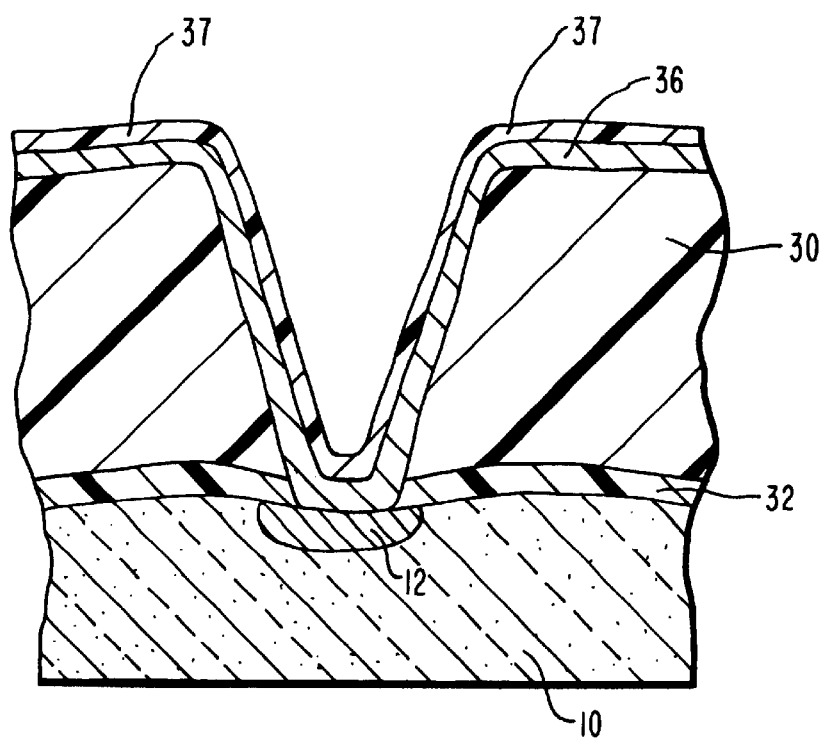
FIG. 5 is a cross-sectional illustration of the silicon wafer of FIG. 4 undergoing yet another step of the method of the present invention.
Figure 6:
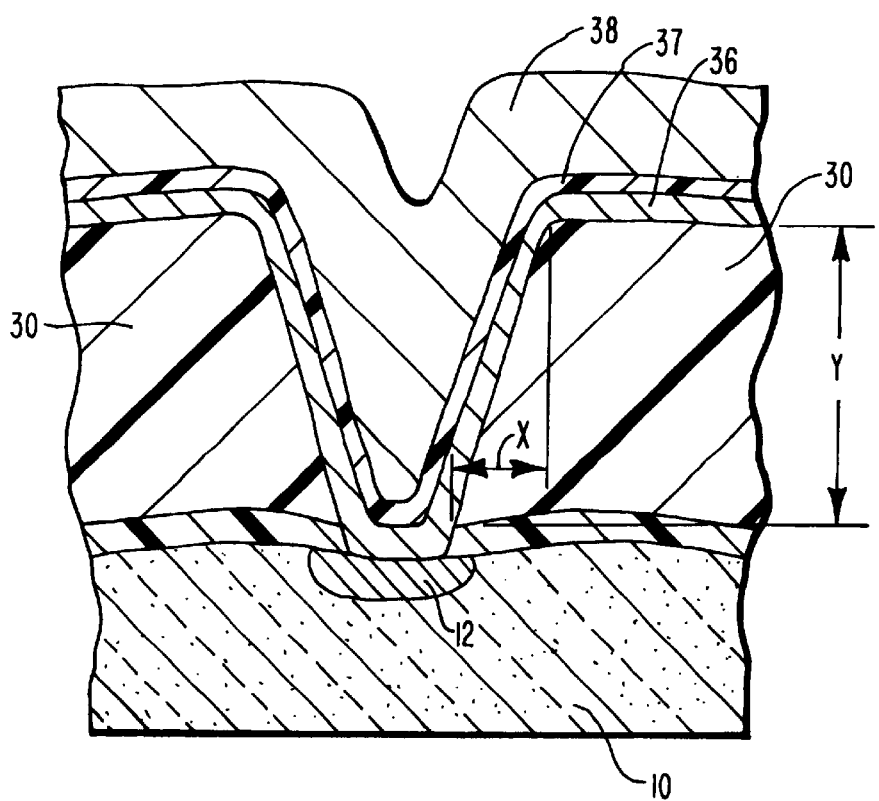
FIG. 6 is a cross-sectional illustration of the silicon wafer of FIG. 5 undergoing final steps of the method of the present invention.

FIG. 5 shows a subsequent step in which a dielectric layer 37 is formed over layer 36 within contact opening 34. As seen in FIG. 6, an upper capacitor plate 38, is deposited above dielectric layer 37 to form the complete capacitor structure. Thus, the sloped profile of the contact opening 34 allows the proper formation of a vertically stacked capacitor such that it can form a buried contact with active region 12, where active region 12 can be properly located between adjacent insulating bird's beak isolation regions so as to substantially reduce the likelihood of leakage. The resultant polysilicon structure from the novel method is stable on the silicon substrate of the wafer such that the structure will not lift off or be deformed. This structural stability results, as can be seen from a comparison of a distance X seen in FIG. 6 to a smaller dimension X seen in the prior art FIG. 2.

When formed with the novel method of the present invention, the capacitor will be vertically oriented and will have the shape of a funnel, rather than the conventional cylindrical shape known in the prior art. Nevertheless, the capacitor formed by the method of the present invention will still exhibit similar electrical characteristics to cylindrical stacked capacitors.

One skilled in the art will recognize that the present invention is not limited to capacitor formation. Rather, any process by which sloped sidewalls must be formed in polysilicon can be accomplished with the present invention, particularly when the contact opening must expose only a limited underlying surface area. The present invention is particularly advantageous, however, for use with vertically oriented capacitors, as described above.

Thus, the present invention provides a novel structure for forming an integrated circuit capacitor which is specifically suitable for DRAM memory modules and other applications where high densities of capacitors are required. The present invention overcomes the problems in the art of leakage of such vertically oriented capacitors. The novel structure of the present invention is provided by a method for etching sloped contact openings in polysilicon with a high oxide selectivity.

The foregoing etching methods described above are preferred to accomplish the sloping of the contact opening sidewalls in polysilicon so as to locate the inner capacitor plate in the proper position on an active area in a silicon substrate. The inventors have found less desirable methods in that such methods provide a difficult structure to etch in a repeatable fashion. For instance, it has been determined that the use of traditional etchants, such as $CF_4$, $SF_6$, $NF_3$, and HBr, are inadequate for forming sloped contact openings in polysilicon. The use of $CF_4$ or any other carbon-containing gas would result in a poor selectivity of polysilicon to oxide. The use of fluorine-containing gases such as $SF_6$ and $NF_3$ would result in a profile which would not have the desirable slope and would also result in poor polysilicon to oxide selectivity. The use of pure HBr as an etchant would result in an etch rate which, once again, would be much too slow. Thus, such lesser methods of etching sloped contact openings are not preferred. However, mixtures of $Cl_2$ and HBr with or without the passivating gases of $N_2$, $O_2$ or $He/O_2$ can be used to increase the selectivity to the underlying oxide.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An electrical device, comprising:
   a substrate having a surface thereon;
   an oxide layer that:
   has a top surface;
   is situated upon the surface of the substrate; and
   has a first recess therein that extends between the top surface of the oxide layer and the substrate;
   a polysilicon layer that:
   has a top surface;
   is situated on the oxide layer; and
   has a second recess therein that extends between the top surface of the polysilicon layer and the top surface of the oxide layer, wherein the first and second recesses are each funnel-shaped;
   a first electrically conductive layer within the first and second recesses and upon the substrate;
   an insulative layer within the second recess and upon the first electrically conductive layer; and
   a second electrically conductive layer within the second recess and upon the insulative layer.

2. The electrical device as recited in claim 1, wherein:
   the substrate is a semiconductor substrate having an active region extending therein from the surface on the substrate;
   the first electrically conductive layer is a first capacitor plate that is in contact with the active region;
   the insulative layer is a cell insulator layer; and
   the second electrically conductive layer is a second capacitor plate.

3. The electrical device as recited in claim 2, wherein the active region has a field oxide bird's beak isolation region adjacent thereto.

4. The electrical device as recited in claim 3, wherein the first recess does not make contact with the field oxide bird's beak isolation region adjacent to the active region.

5. The electrical device as recited in claim 3, wherein the polysilicon layer is in contact with the field oxide bird's beak isolation region adjacent to the active region.

6. The electrical device as recited in claim 1, wherein:
   the second electrically conductive layer has a top surface; and
   the minimum distance between the top surface of the second electrically conductive layer and the top surface of the oxide layer is greater than the minimum distance between the top surface of the polysilicon layer and the top surface of the oxide layer.

7. The electrical device as recited in claim 1, wherein the substrate comprises monocrystalline silicon.

8. The electrical device as recited in claim 1, wherein the second recess has a straight sidewall that makes an acute angle with respect to the surface of the substrate.

9. The electrical device as recited in claim 8, wherein the acute angle is in the range of between about 80 and about 85 degrees.

10. The electrical device as recited in claim 1, wherein:
    the second recess has a height and a width; and
    the height is greater than the width.

11. The electrical device as recited in claim 10, wherein the height is greater than twice the width.

12. The electrical device as recited in claim 11, wherein thrice the width is greater than the height.

13. The electrical device as recited in claim 1, wherein the funnel shape of the first and second recesses is frustoconical.

14. The electrical device as recited in claim 1, wherein the top surface of the polysilicon layer is substantially planar.

15. A capacitor structure, comprising:
    a pair of funnel-shaped recesses, one defined in polysilicon and the other defined in oxide and terminating at a substrate;
    a storage node upon the substrate and the recesses;

a cell dielectric upon the storage node; and a cell plate upon the cell dielectric.

16. A capacitor structure, comprising:

a substrate;

a dielectric layer upon the substrate, having a top surface, and having a first recess therein;

a polysilicon layer upon the dielectric layer, having a top surface, and having a second recess therein, wherein:
the first and second recesses each have a funnel-shape;
the second recess has a width and a height greater than the width;

a first capacitor plate within the first and second recesses and upon the substrate;

a cell insulator layer within the second recess and on the first capacitor plate; and a second capacitor plate within the second recess and upon the cell insulator layer.

17. A capacitor structure as recited in claim 16, wherein the top surface of the polysilicon layer is substantially planar.

18. A capacitor structure, comprising:

a semiconductor substrate having an active area therein;

an oxide layer on the semiconductor substrate;

a polysilicon layer on the oxide layer;

a pair of contiguous funnel-shaped recesses having co-linear sidewalls respectively in the polysilicon layer and the oxide layer, the recess in the oxide layer terminating at the semiconductor substrate;

a storage node upon the active area;

a cell dielectric upon the storage node;

a cell plate upon the cell dielectric; and wherein:
there is a top surface on each of the polysilicon layer, the cell plate, and oxide layer; and
the minimum distance between the top surface of the cell plate and the top surface of the oxide layer is greater than the minimum distance between the top surface of the polysilicon layer and the top surface of the oxide layer.

19. A capacitor structure as recited in claim 18, wherein the top surface of the polysilicon layer is substantially planar.

20. A capacitor structure as recited in claim 18, wherein the semiconductor substrate comprises monocrystalline silicon.

* * * * *